United States Patent
Zocher et al.

(10) Patent No.: US 8,331,486 B1
(45) Date of Patent: Dec. 11, 2012

(54) TRANSMITTER CIRCUIT WITH INTEGRATED POWER CONTROL

(75) Inventors: Andrew G. Zocher, Monticello, IL (US); Arman Hematy, Portland, OR (US)

(73) Assignee: Maxim Integrated Products, Inc., San Jose, CA (US)

( * ) Notice: Subject to any disclaimer, the term of this patent is extended or adjusted under 35 U.S.C. 154(b) by 418 days.

(21) Appl. No.: 12/642,690

(22) Filed: Dec. 18, 2009

(51) Int. Cl.
*H04L 25/03* (2006.01)

(52) U.S. Cl. ........................................ 375/297

(58) Field of Classification Search ................. 375/296, 375/297; 455/126, 127.1
See application file for complete search history.

(56) References Cited

U.S. PATENT DOCUMENTS

| | | | |
|---|---|---|---|
| 2004/0052312 A1* | 3/2004 | Matero | 375/295 |
| 2007/0060074 A1* | 3/2007 | McCune | 455/127.1 |
| 2009/0238258 A1* | 9/2009 | Sjoland | 375/238 |
| 2010/0120384 A1* | 5/2010 | Pennec | 455/126 |

* cited by examiner

*Primary Examiner* — Don N Vo

(74) *Attorney, Agent, or Firm* — TIPS Group

(57) ABSTRACT

An integrated circuit device, set forth by way of example and not limitation, includes an IC package provided with a plurality of leads and enclosing: a) a buffer amplifier, b) a switching-mode power amplifier having an input coupled to the output of the buffer amplifier and having an output coupled to at least one of the plurality of leads, and c) a digital controller. A method, set forth by way of example and not limitation, for controlling the power output of a RF transmitter circuit without the need for an attenuator includes developing a signal source, applying the signal source to a buffer amplifier to provide an amplified signal, applying the amplified signal to a switching-mode power amplifier to provide a power output signal, and controlling a gain of the switching-mode power amplifier in response to a digital command.

9 Claims, 4 Drawing Sheets

TRANSMITTER CIRCUIT WITH INTEGRATED POWER CONTROL

BACKGROUND

There is a need for low-powered radio frequency ("RF") transmitters for such purposes as remote control or remote monitoring. For example, low-powered RF transmitters are used in garage door openers, automatic meter reading (AMR), remote keyless entry (RKE) and home automation. In order to accommodate this need, the Federal Communications Commission ("FCC") has set aside certain radio frequency ranges ("bands") known as "unlicensed ISM radio bands." The maximum permitted power of transmitters operating in various ISM radio bands can vary. Exceeding the designated maximum power for a particular band is a violation of FCC rules in the U.S. and ETSI rules in Europe.

The need to set a maximum power for RF transmission has been addressed in the prior art. For example, attenuators have been used to reduce RF power. However, attenuators are expensive and wasteful of energy. This is particularly problematic with battery operated devices, such as remote controls.

In the past, cost constraints have dictated relatively inexpensive amplifiers to be used in battery-powered RF devices. For example, inexpensive class A amplifying devices have been widely used. Class A amplifiers operate over the whole of the input cycle such that the output signal is an exact scaled-up replica of the input with no clipping. However, class A amplifiers are not very efficient and only have a theoretical maximum of 50% efficiency.

More recently, more efficient switching amplifiers have been used. Switching amplifiers are referred to as class E/F amplifiers and are highly efficient.

FIG. 1 illustrates a transmitter system 10 of the prior art which includes a high efficiency switching amplifier. The transmitter system 10 includes an integrated circuit (IC or "chip") 12, designated by the broken lines, having the switching amplifier and a number of "off chip" components such as a microcontroller (μC) 14, memory 16, RF choke (inductor) 18, resistor 20, bypass capacitor 22, attenuator 24, matching network 26 and a load $R_L$ (e.g. an antenna). The microcontroller 14 and memory 16 are used to digitally control the frequency of an output signal developed at an output 28 of the integrated circuit 12 and the resistor 20 is used to control the power of the output signal at output 28. The resistor 20 limits the maximum power that is delivered to the load (to meet FCC requirements) and the matching network 26 matches the impedance of the output signal to the load $R_L$. In transmitter systems which do not use a resistor 20 to control the power, and the power output is fixed, an optional attenuator 24 can be coupled between the matching network 26 and load $R_L$ to prevent excessive power transmission. However, the optional attenuator 24 is not required if the power level is properly controlled by a resistor.

Integrated circuit 12 includes, among other components, a signal source 30, a buffer amplifier 32 and a switching-mode power amplifier 34. The frequency of the signal source 30 can be digitally controlled by microcontroller 14. For example, the signal source 30 can be a programmable phase lock loop (PLL). The buffer amplifier 32 provides a first stage of amplification and signal conditioning, and the switching-mode power amplifier 34 boosts the power which is developed at output 26. Integrated circuits similar to integrated circuit 12 have been developed by Maxim Integrated Products of Sunnyvale Calif. as, for example, product numbers MAX1472, MAX7044, MAX1479, MAX703x, MAX7057 and MAX7058.

The series connection of inductor 18 and resistor 20 between the output 28 of integrated circuit 12 and a voltage source $V_{DD}$ allows the power of the signal at output 28 to be controlled. This is accomplished by varying the resistance of resistor 20 to change the voltage level at the output 28 and thus the drain of power transistor (e.g. a MOSFET power transistor) 34. Due to the inductor 18, the voltage at the output 28 can vary up to a maximum of twice that of the voltage source ($2 \times V_{DD}$). As the resistance of resistor 20 goes up, the voltage level (and therefore the power) at output 28 goes down, and vice versa. The bypass capacitor 22 shunts high frequency signals to ground.

While the described integrated circuit 12 has many advantages over prior art transmitters using less-efficient amplifiers, there is still room for improvement. For example, since the integrated circuit 12 allows the frequency at the output 28 to be varied, care must be taken to make sure the power output of the integrated circuit 12 does not exceed those proscribed by FCC regulations. This requires either an off-chip resistor (such as resistor 20) or an energy-wasteful attenuator 24. Furthermore, since the resistor 20 which determines the power output of the integrated circuit 12 is "off chip" and is selected by a system integrator, the correct resistance value and the temperature characteristics of the system 10 must be empirically determined.

FIG. 2 is a graph illustrating a typical supply current and output power vs. external resistor curve of an RF transmitter system of FIG. 1. As noted above, a problem with this power control method is that an external resistor is required and that the gain cannot be changed 'on the fly.' In addition, the control characteristic is very non-linear with respect to power in dBm.

Amplifiers with a linear-in-dB control characteristic are desirable for a variety of RF system applications including gain control for receivers and level control for transmitters. Some circuit techniques have already been developed for linear-in-dB power control amplifiers. For example, there are those which utilize the exponential I-V relationship of bipolar junction transistors (see, for example, U.S. Pat. Nos. 5,200,655 and 5,684,431) and there are others that utilize the scaling properties of MOS devices (see, for example, U.S. Pat. Nos. 7,391,260 and 7,403,071). All of these techniques, however, are only operative with amplifiers that operate in the class A mode.

These and other limitations of the prior art will become apparent to those of skill in the art upon a reading of the following descriptions and a study of the several figures of the drawing.

SUMMARY

In an embodiment, set forth by way of example and not limitation, an RF transmitter circuit with output power control includes a buffer amplifier stage, a switching-mode power amplifier stage having an input coupled to an output of the buffer amplifier and having a power output, a DAC having a digital input and an analog output, and an inductor coupling the analog output of the DAC to the switching-mode power amplifier stage. In an example alternate embodiment, the analog output of the DAC is an exponential function of the digital input. In another example alternate embodiment the DAC includes logic including a number of inputs, a reference voltage source controllable by the logic to provide a variable reference voltage, a regulator having a first input coupled to the variable reference voltage, an electronic valve having a control input coupled to an output of the regulator and a first node coupled to a voltage source, and a variable voltage divider circuit includes a series connection of at least two resistors, at least one of which is controllable by the logic, where a node between the at least two resistors is coupled to a second input of the regulator.

In an embodiment, set forth by way of example and not limitation, an integrated circuit device includes an IC package provided with a plurality of leads and enclosing: a) a buffer amplifier, b) a switching-mode power amplifier having an input coupled to the output of the buffer amplifier and having an output coupled to at least one of the plurality of leads, and c) a controller. In this example embodiment, a digital input of the controller is coupled to at least two of the plurality of leads and output of the controller is coupled to another lead to operationally provide a digitally controlled voltage source. In an example alternate embodiment the DAC is an exponential DAC and in a more specific example alternate embodiment the power amplifier can be controlled by the DAC to provide linear-in-dB power control of the integrated circuit device.

In an embodiment, set forth by way of example and not limitation, a method for controlling the power output of a RF transmitter circuit includes developing a signal source, applying the signal source to a buffer amplifier to provide an amplified signal, applying the amplified signal to a power amplifier to provide a power output signal, and controlling a gain of the power amplifier in response to a digital command. In an example alternate embodiment, the act of controlling the gain includes converting a digital input into an analog control signal and, in a more specific example alternate embodiment, the relationship between the digital command and the power output signal is linear-in-dB.

An advantage of certain embodiments, set forth by way of example and not limitation, is that RF power levels can be adjusted to appropriate maximum levels for various radio bands without the need for energy-wasteful attenuators.

An advantage of certain embodiments, set forth by way of example and not limitation, is that an RF power level can be simply controlled through a digital input.

An advantage of certain embodiments, set forth by way of example and not limitation, is that an RF power level can be accurately adjusted in, for example, discrete steps.

An advantage of certain embodiments, set forth by way of example and not limitation, is that a RE power can be developed which is stable over a significant range of temperatures.

An advantage of certain embodiments, set forth by way of example and not limitation, is that it allows the maintenance of the highest FCC permitted transmission ("TX") power at every garage door opener ("GDO") frequency An advantage of certain embodiments, set forth by way of example and not limitation, is that it implements a mathematical function using fully-integrated linear-in-dB control, which is a highly desired control curve for radio frequency power control.

An advantage of certain embodiments, set forth by way of example and not limitation, is that it utilizes the characteristics of switching-mode amplifiers to retain efficiency as power is backed off.

These and other embodiments and advantages and other features disclosed herein will become apparent to those of skill in the art upon a reading of the following descriptions and a study of the several figures of the drawing.

BRIEF DESCRIPTION OF THE DRAWINGS

Several example embodiments will now be described with reference to the drawings, wherein like components are provided with like reference numerals. The example embodiments are intended to illustrate, but not to limit, the invention. The drawings include the following figures.

DETAILED DESCRIPTION OF EXAMPLE EMBODIMENTS

Figure 1:
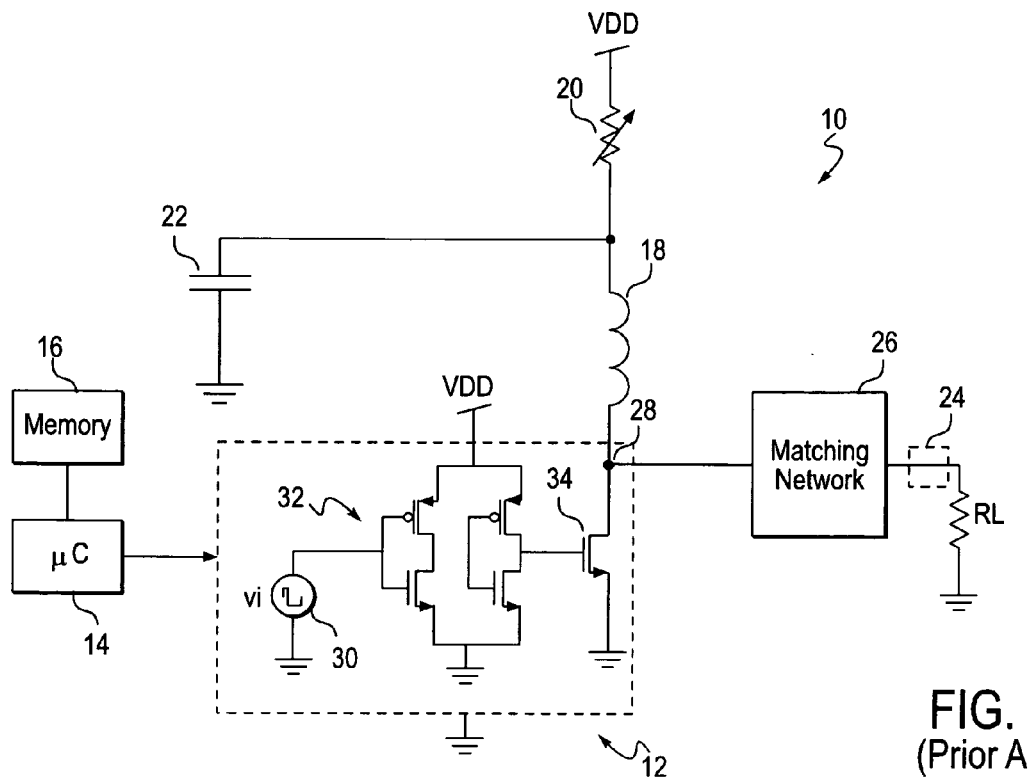
FIG. 1 is a block diagram of a RF transmitter circuit used to illustrate various embodiments of the prior art.
Figure 2:
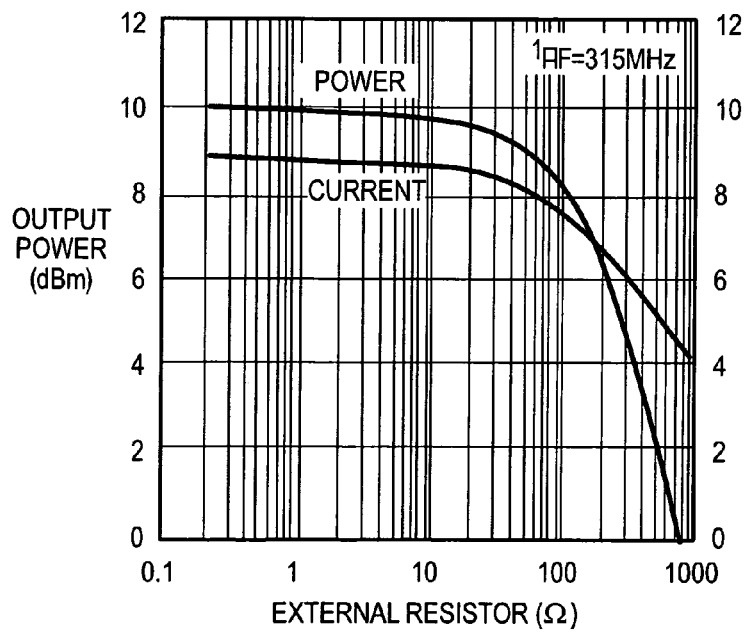
FIG. 2 is a graph illustrating a typical supply current and output power vs. external resistor curve of an RF transmitter circuit of FIG. 1.
Figure 3:
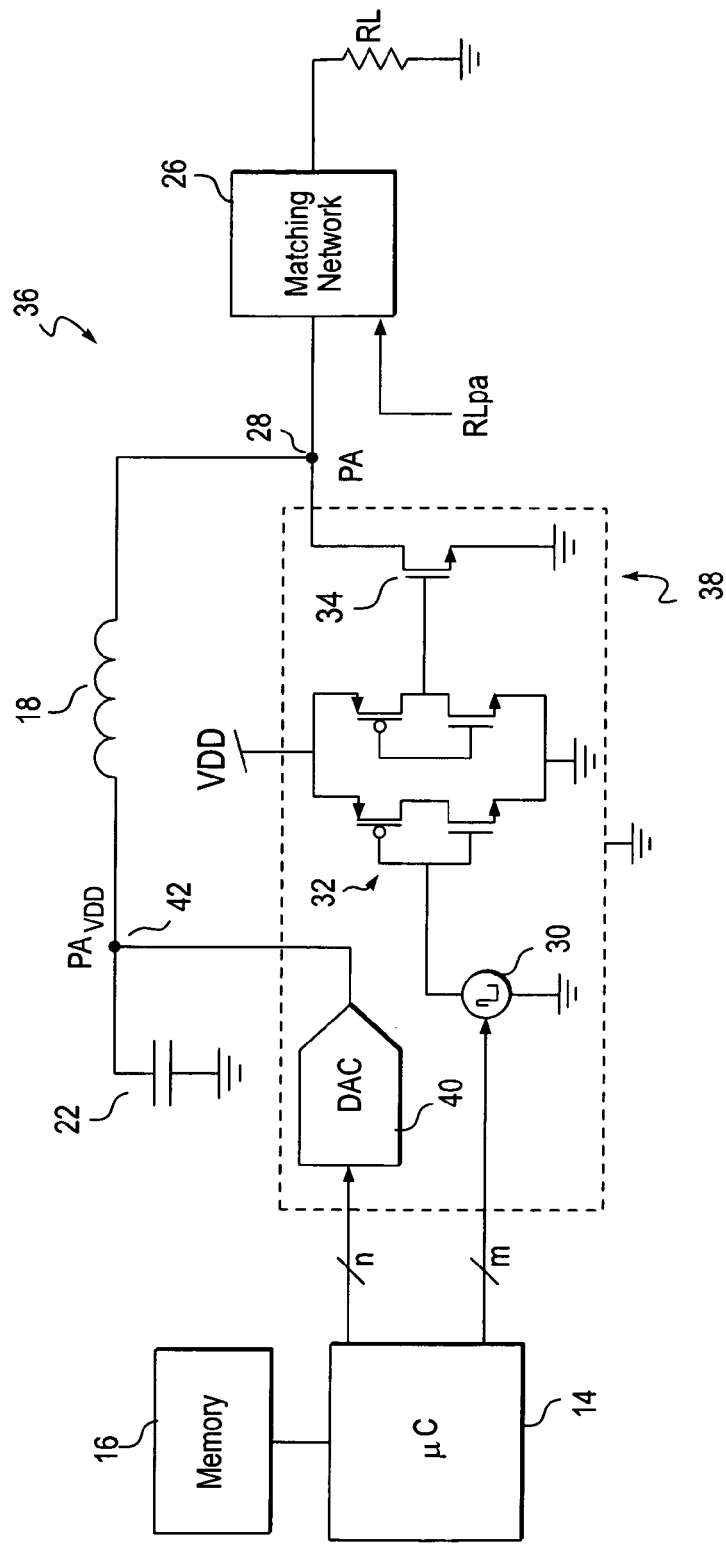
FIG. 3 is a block diagram of an embodiment, set forth by way of example and not limitation, of a RF transmitter system with integrated power control.

FIGS. 1 and 2 were discussed with reference to the prior art. FIG. 3 illustrates, by way of example but not limitation, an RF transmitter system 36 with integrated power control. It will be noted that the transmitter system 36 of FIG. 3 is an improvement upon the transmitter system 10 described with reference to FIG. 1. To the extent that elements of the transmitter circuits are similar, similar references will be used.

By way of non-limiting example, FIG. 3 illustrates a transmitter system 36 which, like transmitter system 10, includes a high efficiency switching amplifier. The transmitter system 36 includes an integrated circuit (IC) 38, designated by the broken lines, having the switching amplifier. Transmitter system 36 also includes a number of "off chip" components such as a microcontroller (μC) 14, memory 16, RF choke (inductor) 18, bypass capacitor 22, matching network 26 and a load $R_L$ (e.g. an antenna). It should be noted that the transmitter system 36, of this example, does not require the external resistor to adjust its power level or an attenuator to limit the power delivered to the load $R_L$. Of course, certain office chip components can be integrated on-chip, and vice versa. The microcontroller 14 and memory 16 can be used to digitally control both the frequency of an output signal developed at a power output 28 of the integrated circuit 38. The matching network 26 matches the impedance of the load $R_L$ to the rest of the system.

In this example embodiment, integrated circuit 38 includes, among other components, a programmable signal source 30, a buffer amplifier 32 and a switching-mode power amplifier 34. The frequency of the signal source 30 can be digitally controlled by microcontroller 14. For example, the signal source 30 can be a programmable phase lock loop (PLL). The buffer amplifier 32 provides a first stage of amplification and signal conditioning, and the switching-mode power amplifier 34 boosts the power which is developed at output 26. The design and implementation of signal source 30, buffer amplifier 32 and switching-mode power amplifier 34 on an integrated circuit is well known to those of skill in the art.

Integrated circuit 38, in this example embodiment, further includes a digital-to-analog converter (DAC) 40. As seen in FIG. 3, the DAC 40 has, as an input, an N-bit word developed by the microcontroller 14, i.e. the DAC 40 has N input lines in this example. Under microcontroller 14 control, the voltage output of DAC 40 can be adjusted in $2^N$ increments to develop a voltage $PA_{VDD}$ which is applied to a node 42 between the inductor 18 and the capacitor 22. By way of non-limiting example, if N=5, then the power can be adjusted in $2^5$ or 32 increments or steps. As such, DAC 40 provides a digitally controlled voltage source. However, it must be emphasized that the DAC 40 is just an example of a controller which can provide a digitally controlled voltage source, and other such controllers are well known to those of skill in the art.

The signal source 30 has, in this example embodiment, an M-bit word input that is developed by the microcontroller 14. The frequency of the integrated circuit 38 can therefore be adjusted in $2^M$ increments. The constant M can be greater than, equal to, or less than the constant N.

Since the output voltage $PA_{VDD}$ of DAC 40 is under microcontroller 14 control, the relation between the steps in the N-bit word and the power developed at the output 28 of the integrated circuit 38 can be virtually any function. That is, the microcontroller 14 along with program instructions and, perhaps, lookup tables stored in, for example, memory 16 can create a virtually unlimited variety of waveforms that relate the output power of the integrated circuit 38 to the N-bit word input into the DAC 40. By way of non-limiting example, the output power of the integrated circuit 38 can be programmed to be linear-in-dB with respect to the least significant bits (LSB) of the N-bit word (aka "Power Codes").

In an embodiment, set forth by way of example and not limitation, DAC 40 is an exponential voltage DAC, with an output power that can be expressed as:

$$PA_{VDD} = ke^{qn} \quad \text{(Equation 1)}$$

where, in Equation 1, $PA_{VDD}$ is the D.C. voltage at the output of the DAC, k and q are constants, and n is the DAC setting in least significant bits ("LSBs"). That is, the variable n is used to signify a value ("Power Code") of the N-bit word in the range of zero to N−1.

Figure 4:
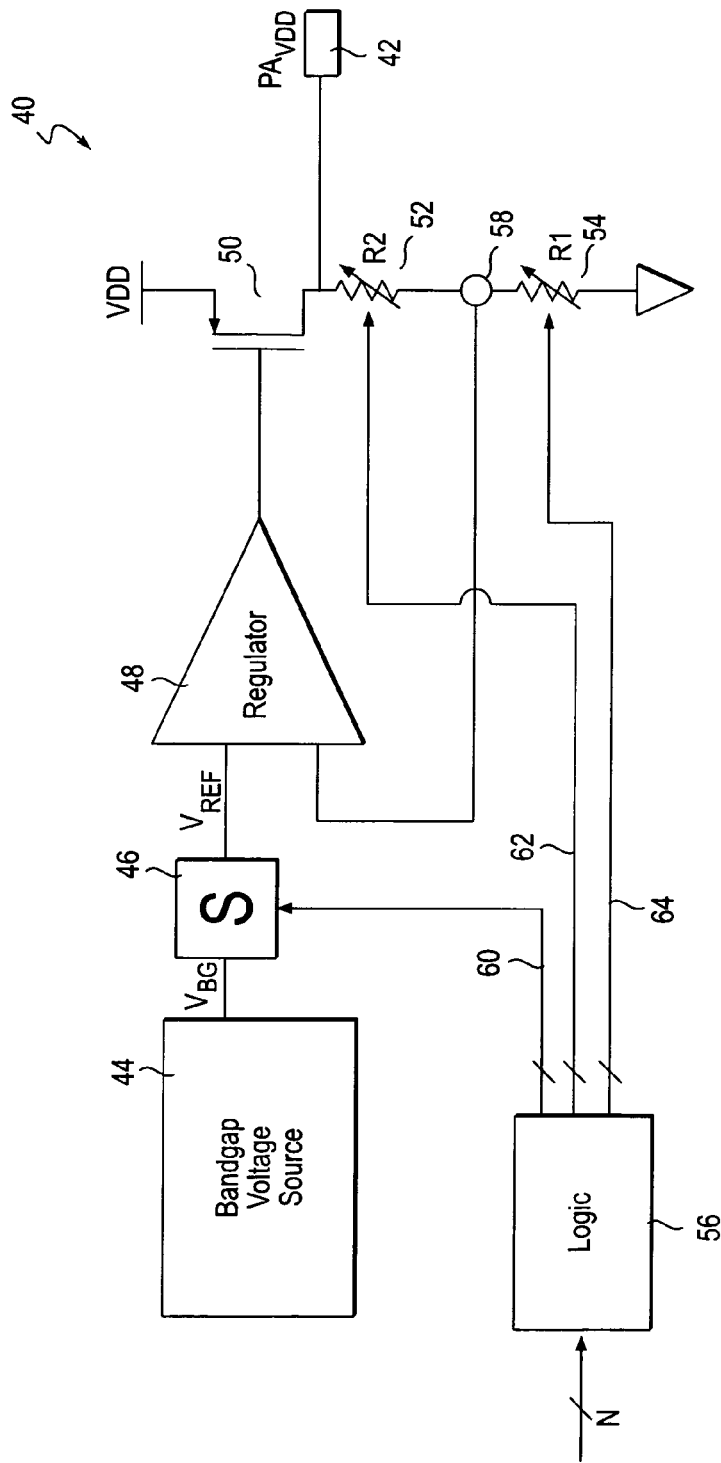
FIG. 4 is a block diagram of an embodiment, set forth by way of example and not limitation, of a DAC of FIG. 3.

FIG. 4 is a block diagram of an embodiment, set forth by way of example and not limitation, of a DAC of FIG. 3 which operates as an exponential voltage DAC. In this example embodiment, DAC 40 includes a bandgap voltage source 44, a scale factor (S) device 46, a regulator 48, a transistor (e.g. MOSFET) device 50, resistors (R2) 52 and (R1) 54, and logic 56. The node between transistor device 50 and resistor 52 is coupled to node 42 and develops the voltage $PA_{VDD}$.

In the example embodiment of FIG. 4, the bandgap voltage source 44 develops a steady, consistent voltage $V_{BG}$. The bandgap voltage source 44 can, by way of non-limiting example, provide a steady voltage of 1.14 volts. The scale factor device 46, which is essentially a DC-to-DC up-converter, multiplies the voltage $V_{BG}$ by the scaling factor S such that a reference voltage $V_{REF}=S*V_{BG}$ is developed. This reference voltage is applied to one input of voltage regulator 48. The output of the voltage regulator 48 is coupled to the gate of transistor device 50. The source of the transistor device 50 is coupled to $V_{DD}$ and its drain is coupled to a node of resistor 52. A node 58 between resistors 52 and 54 (i.e. a series connection of two resistors) is coupled to a second input to regulator 48 to provide a feedback loop to the regulator.

The N-bit input to DAC 40 is applied to logic 56 which outputs a number of control busses including, by way of non-limiting example, control busses 60, 62 and 64. Control bus 60 can be used to control the value of S of scale factor device 46, control bus 62 can be used to vary the resistance of resistor 52 and control bus 64 can be used to vary the resistance of resistor 54. The design and implementation of digitally controlled scale factor devices and variable resistors is well known to those of skill in the art.

With continuing reference to FIG. 4, the voltage $PA_{VDD}$ is given by the following equation:

$$PA_{VDD} = V_{REF} \cdot \frac{R_1 + R_2}{R_1} = V_{REF} \cdot \left(1 + \frac{R_2}{R_1}\right) \quad \text{(Equation 2)}$$

By way of non-limiting example, two bits or selection for voltage levels $V_{REF}$ and three bits of gain selection can be chosen for the feedback to the regulator. Each increase in the $V_{REF}$ voltage level will increase the output power by 8 dB. Then the feedback resistors R1 and R2 will gain the level by eight steps of 1 dB in this non-limiting example Table 1, below, illustrate the $PA_{VDD}$ voltage levels and their corresponding ideal and actual PA output power as determined by testing an example ADC 40 of FIG. 4.

TABLE 1

| PAVDD (V) | Ideal PA Power (dBm) | Actual PA Power (dBm) |
|---|---|---|
| 2.91 | 15 | 14.5 |
| 2.60 | 14 | 13.8 |
| 2.314 | 13 | 13 |
| 2.054 | 12 | 12.3 |
| 1.833 | 11 | 11.3 |
| 1.638 | 10 | 10.3 |
| 1.456 | 9 | 9.3 |
| 1.30 | 8 | 8.3 |
| 1.12 | 7 | 7.0 |
| 1.00 | 6 | 6.3 |
| 0.89 | 5 | 5.0 |
| 0.79 | 4 | 4.0 |
| 0.70 | 3 | 2.8 |
| 10.64 | 2 | 2.1 |
| 0.56 | 1 | 0.8 |
| 0.50 | 0 | 0 |
| 0.45 | −1 | −1.0 |
| 0.40 | −2 | −1.8 |
| 0.356 | −3 | −2.8 |
| 0.316 | −4 | −3.8 |
| 0.282 | −5 | −4.8 |
| 0.252 | −6 | −5.7 |
| 0.224 | −7 | −6.7 |
| 0.20 | −8 | −7.7 |
| 0.179 | −9 | −8.7 |
| 0.16 | −10 | −9.7 |
| 0.142 | −11 | −10.5 |
| 0.126 | −12 | −11.7 |
| 0.113 | −13 | −12.5 |
| 0.10 | −14 | −13.5 |
| 0.089 | −15 | −14.7 |
| 0.08 | −16 | −15.7 |

The DAC design of FIG. 4 is but one example of potential DAC designs. As will be appreciated by those of skill in the art, there a variety of linear and non-linear DAC designs which can be used to achieve a desired relationship between the N-bit input and the power output of the integrated circuit 38. It will also be appreciated that certain components of system 36, such as the microcontroller 14 and/05 memory 16 by way of non-limiting examples, can be integrated into integrated circuit 38.

For example, instead of using an exponential voltage DAC, a linear voltage DAC could be used with a look-up table to emulate an exponential output or any other waveform. As another, non-limiting example, a buck converter with feedback from an RF sensor on the output of the integrate circuit can be used. As yet another non-limiting example, a multiplying DAC with a lookup table (stored in memory either on the integrated circuit or off-chip) can be used. It will be appreciated by those of skill in the art that the analog output of a DAC can be either a linear or a non-linear function of its digital input.

With reference to FIG. 3, if the impedance at the output 28 of the integrated circuit 38 at a given operating frequency is RLpa, then the ideal RF output power (PA) at output 28 can be expressed as:

$$PA = PA_{VDD}^2 / 2 / RLpa \quad \text{(Equation 3)}$$

When the RF output power is expressed in dBm, the relationship between the RF power and the DAC setting is $$PA\ (dBm) = 10 * \log(PA_{VDD}(V)^2 / 2 / RLpa(k\Omega))$$
$$\Rightarrow PA\ (dBm) = 10 * \log(k^2 / 2 / RLpa(k\Omega)) + 20 * \log(e^{qn})$$

and, ultimately $$PA\ (dBm) = a + bn \quad \text{(Equation 4)}$$

where
  $a = 10 * \log(k^2/2/RLpa(k\Omega))$ and
  $b = 20 * q / \ln(e)$

Figure 5:
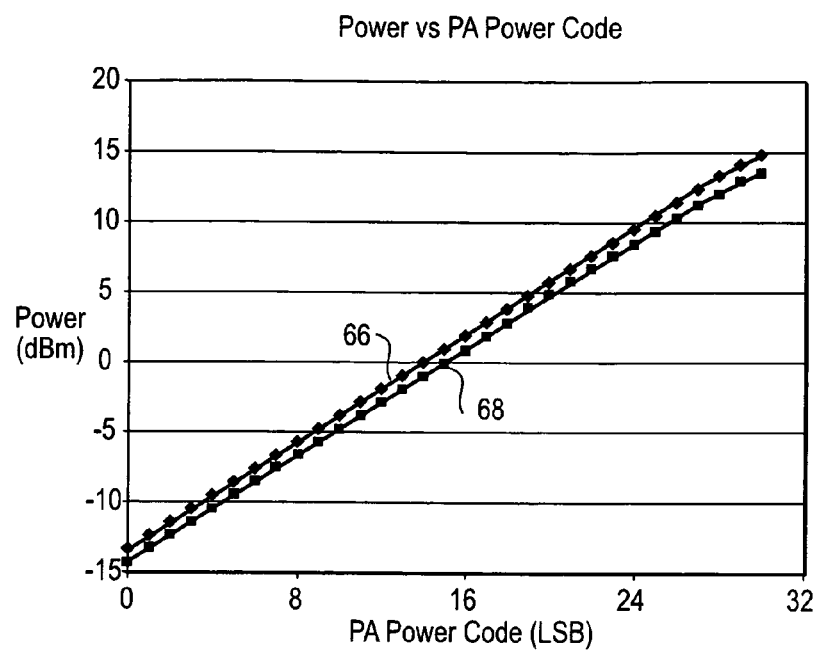
FIG. 5 is a graph illustrating a power vs. PA power code curves at two different temperatures for the embodiments of FIGS. 3 and 4.

The relationship as set forth in Equation 4, above, indicates that the power, when expressed in dBm, is linear with respect to the DAC input word. This can been seen graphically in FIG. 5 with substantially linear curves 60 and 68, taken at 25° C. and 125° C., respectively. Therefore, linear-in-dB power control is effectively achieved in this example embodiment.

Figure 6:
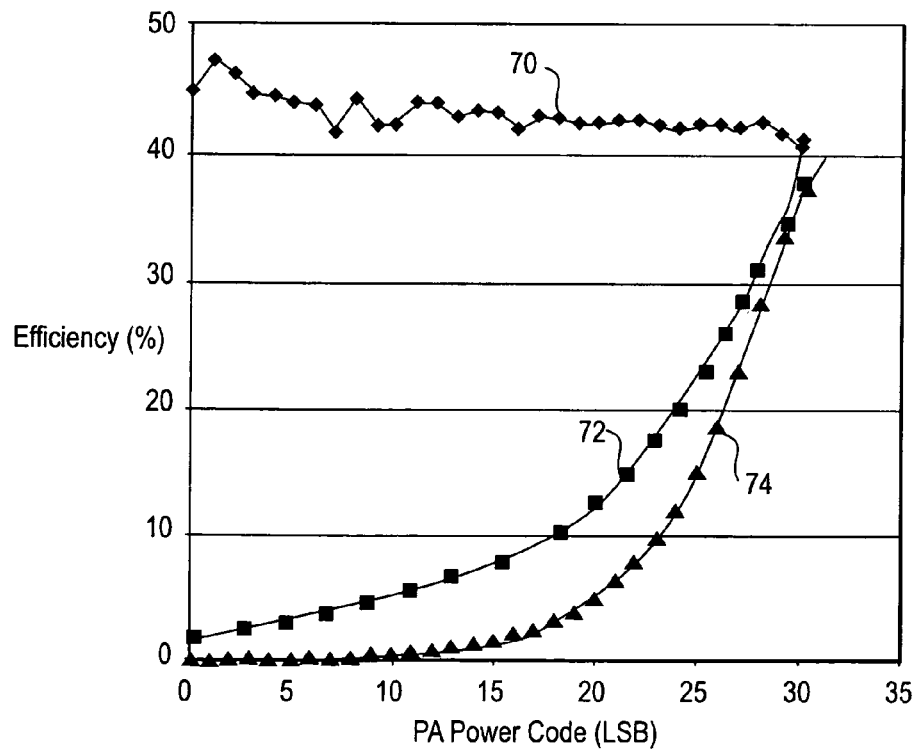
FIG. 6 is a graph illustrating efficiency vs. PA power codes for both the embodiments of FIGS. 3 and 4 and the prior art illustrated in FIG. 1.

In FIG. 6, the relationship of Equation 4 as set forth above indicates that the power when expressed in dBm is linear with respect to the value of the DAC input word. The measured linear-in-dB characteristic was determined to be accurate over almost three orders of magnitude of output power. The output power characteristic was found to be accurate to within 0.2 dB over the full output power range and the variation over temperature was found to be within +/−1.5 dB over the range of −40 C to 125 C.

Another benefit of this power control method is that it offers improved efficiency when compared to embodiments of the prior art which use fixed output power transmitters and attenuators to limit output power. In FIG. 6, curve 74 is the drain efficiency of switching-mode power amplifier 34 of FIG. 3 ("PA") which is nearly constant over its power control range. The curve 72 illustrates a composite efficiency of the exponential voltage DAC 40 and PA. The prior art fixed output power PA followed by an ideal step attenuator with 0 dB minimum insertion loss, is illustrated by curve 74.

It should be noted that the embodiment of FIG. 3 is considerably more energy efficient than the prior art illustrated in FIG. 1. Maximizing efficiency is important in battery-powered applications such as in remote control and remote sensing.

While non-limiting examples refer to certain frequency ranges or bands other embodiments may operate in other frequency ranges or bands. Some example embodiments contemplate integration of circuitry on one or more integrated circuit chips, while other embodiments can be created from discrete components or a combination of integrated circuit chips and discrete components. It will therefore be appreciated that although various embodiments have been described using specific terms and devices, such description is for illustrative purposes only. The words used are words of description rather than of limitation. It is to be understood that changes and variations may be made by those of ordinary skill in the art without departing from the spirit or the scope of the present invention, which is set forth in the following claims. In addition, it should be understood that aspects of various other embodiments may be interchanged either in whole or in part. It is therefore intended that the claims be interpreted in accordance with the true spirit and scope of the invention without limitation or estoppel.

What is claimed is:

1. A transmitter circuit with output power control comprising:
   a buffer amplifier stage having an input and an output;
   a switching-mode power amplifier stage having an input coupled to said output of said buffer amplifier and having a power output;
   a DAC having digital input and an analog output;
   an inductor coupling said analog output of said DAC to said switching-mode power amplifier stage, whereby a power level at said power output is controlled by said digital input to said DAC; and
   a signal source coupled to said input of said buffer amplifier and a bypass capacitor coupling said analog output of said DAC to ground;
   wherein said input of said power amplifier stage comprises a gate of a MOSFET a source of said MOSFET is coupled to ground, and a drain of said MOSFET is coupled to said inductor said analog output of said DAC is a non-linear function of said digital input, and said analog output of said DAC is an exponential function of said digital input;
   wherein said exponential function is substantially:

$$PA_{VDD} = k e^{qn}$$

where $PA_{VDD}$ is a D.C. voltage on said drain of said MOSFET, k and q are constants and n is a number of significant bits input into said DAC.

2. A transmitter circuit with output power control as recited in claim 1 wherein said buffer amplifier stage, said switching-mode power amplifier stage and said DAC comprise an integrated circuit device.

3. A transmitter circuit with output power control comprising:
   a buffer amplifier stage having an input and an output;
   a switching-mode power amplifier stage having an input coupled to said output of said buffer amplifier and having a power output;
   a DAC having a digital input and an analog output;
   an inductor coupling said analog output of said DAC to said switching-mode power amplifier stage, whereby a power level at said power output is controlled by said digital input to said DAC; and
   a signal source coupled to said input of said buffer amplifier and a bypass capacitor coupling said analog output of said DAC to ground;
   wherein said input of said power amplifier stage comprises a gate of a MOSFET, a source of said MOSFET is coupled to ground, and a drain of said MOSFET is coupled to said inductor, said analog output of said DAC is a non-linear function of said digital input, and said analog output of said DAC is an exponential function of said digital input; and
   wherein said DAC comprises:
     logic including at least N inputs;
     a reference voltage source controllable by said logic to provide a variable reference voltage;
     a regulator having a first input coupled to said variable reference voltage;
     an electronic valve having a control input coupled to an output of said regulator and a first node coupled to a voltage source; and
     a variable voltage divider circuit comprising a series connection of at least two resistors, at least one of which is controllable by said logic, where a node between said at least two resistors is coupled to a second input of said regulator.

4. A transmitter circuit with output power control as recited in claim 3 wherein said buffer amplifier stage, said switching-mode power amplifier stage and said DAC comprise an integrated circuit device.

5. An integrated circuit device comprising an IC package provided with a plurality of leads, said package enclosing:
   a) a buffer amplifier having an input and an output;
   b) a switching-mode power amplifier having an input coupled to said output of said buffer amplifier and having an output coupled to at least one of said plurality of leads; and
   c) a controller having a digital input and an analog output, wherein said digital input of said controller is coupled to at least two of said plurality of leads other than said at least one of said plurality of leads to which said output of said switching-mode power amplifier is coupled, and wherein said output of said controller is coupled to another of said plurality of leads to operationally provide a digitally controlled voltage source; wherein said controller comprises a DAC including
   logic including at least N inputs;
   a reference voltage source controllable by said logic to provide a variable reference voltage;
   a regulator having a first input coupled to said variable reference voltage;
   an electronic valve having a control input coupled to an output of said regulator and a first node coupled to a voltage source; and
   a variable voltage divider circuit comprising a series connection of at least two resistors, at least one of which is controllable by said logic, where a node between said at least two resistors is coupled to a second input of said regulator.

6. An integrated circuit device as recited in claim 5 further comprising a signal source enclosed within said package and coupled to said input of said buffer amplifier.

7. An integrated circuit device as recited in claim 5 wherein said switching-mode power amplifier is controlled by said DAC to provide linear-in-dB power control of said integrated circuit device.

8. A method for controlling a power output of a RF transmitter circuit without a need for an attenuator comprising:
   developing a signal source;
   applying said signal source to a buffer amplifier to provide an amplified signal;
   applying said amplified signal to a switching-mode power amplifier to provide a power output signal; and
   controlling a gain of said switching-mode power amplifier in response to a digital command using a DAC which converts said digital input to an analog control signal which is an exponential function of said digital input;
   wherein an input of said power amplifier stage comprises a gate of a MOSFET and where a source of said MOSFET is coupled to ground and wherein said exponential function is substantially:

$$PA_{VDD} = ke^{qn}$$

where $PA_{VDD}$ is a D.C. voltage on said drain of said MOSFET, k and q are constants and n is a number of significant bits input into said DAC.

9. A method for controlling a power output of a RF transmitter circuit without a need for an attenuator as recited in claim 8 wherein a relationship between said digital command and said power output signal is linear-in-dB.

* * * * *